United States Patent [19]

Hamilton et al.

[11] Patent Number: 5,010,346

[45] Date of Patent: Apr. 23, 1991

[54] ELECTRO-OPTICAL ANALOG-TO-DIGITAL CONVERTER AND METHOD FOR DIGITIZING AN ANALOG SIGNAL

[75] Inventors: Michael C. Hamilton; John A. Bell, both of Redmond, Wash.

[73] Assignee: The Boeing Company, Seattle, Wash.

[21] Appl. No.: 427,730

[22] Filed: Oct. 27, 1989

[51] Int. Cl.$^5$ .............................................. H03M 1/00
[52] U.S. Cl. ................................ 341/137; 250/227.14; 250/227.12; 250/227.21; 350/96.14
[58] Field of Search ..................... 341/137; 372/12; 350/96.14; 250/227.12, 227.14, 227.21, 575, 576

[56] References Cited

U.S. PATENT DOCUMENTS

| | | | |
|---|---|---|---|
| H,353 | 10/1987 | Taylor | 340/347 AD |
| 3,670,166 | 6/1972 | Kaminow | 250/199 |
| 3,892,468 | 7/1975 | Duguay | 350/96 B |
| 3,925,727 | 12/1975 | Duguay | 250/227.12 X |
| 3,997,894 | 12/1976 | Levine | 340/347 AD |
| 4,058,722 | 11/1977 | Taylor | 350/96.14 X |
| 4,164,373 | 8/1979 | Schuss et al. | 250/227.12 X |
| 4,325,603 | 4/1982 | Marom | 341/137 X |
| 4,427,895 | 1/1984 | Eng | 250/551 |
| 4,502,037 | 2/1985 | Le Parquier et al. | 340/347 AD |
| 4,571,576 | 2/1986 | Olsson et al. | 341/137 |
| 4,694,276 | 9/1987 | Rastegar | 340/347 AD |
| 4,770,483 | 9/1988 | Ridgway | 341/137 X |

FOREIGN PATENT DOCUMENTS

| | | |
|---|---|---|
| 56-80029 | 7/1981 | Japan . |
| 60-254991 | 12/1985 | Japan . |
| 61-81099 | 4/1986 | Japan . |
| 61-156231 | 7/1986 | Japan . |
| 1246368 | 7/1986 | U.S.S.R. . |

OTHER PUBLICATIONS

Taylor, Henry F.; "An Optical Analog-to-Digital Converter—Design and Analysis;" *IEEE Journal of Quantum Electronics*, vol. QE-15, No. 4; Apr. 1979.

Leonberger, Frederick J. et al.; "Design and Development of a High-Speed Electrooptic A/D Converter;" *IEEE Transactions on Circuits and Systems*, vol. CAS-26, No. 12; Dec. 1979.

*Primary Examiner*—Benjamin R. Fuller
*Assistant Examiner*—Randy W. Gibson

*Attorney, Agent, or Firm*—Christensen, O'Connor, Johnson & Kindness

[57] ABSTRACT

An electro-optical analog-to-digital converter having an enhanced effective sample rate. Several embodiments of the electro-optical analog-to-digital converter (10, 100, 150, and 200) are described, each involving either space-division demultiplexing, time-division demultiplexing, or wavelength-division demultiplexing to increase the effective sample rate at which an analog signal provided by a source (36) can be converted to a digital signal using electrical analog-to-digital converters (66). A plurality of light pulses having a constant amplitude are modulated in response to the analog signal and demultiplexed using one of the three different techniques, so that the analog signal is sampled at successive points in time, varying the intensity of light pulses passing through each modulator channel (32, 104). In the space-division demultiplexing approach, light pulses produced by a mode-locked diode laser (12) are split into a plurality of channels and delayed by different time intervals so that the replicated pulses are spaced apart in time prior to being modulated by passage through a modulator array (32). The demultiplexed and modulated light pulses are input to a plurality of photodetectors (56) amplified by a plurality of amplifiers (60), and input to a plurality of electrical analog-to-digital converters (64). In the time-division multiplexing approach, either discrete optical switches (108) or an optical switch array (158) is used to transmit successive modulated light pulses into selected photodetectors for conversion to an electrical signal that is input to the analog-to-digital converters. The wavelength-division multiplexing approach uses a plurality of mode-locked diode lasers (210), each having a different characteristic wavelength. Pulses output from the mode-locked diode lasers are generated at different times and provided to a wavelength-division multiplexer (214) where they are combined and input to the modulator. A wavelength-division demultiplexer (220) separates the different wavelength pulses for input to selected photodetectors. For all the embodiments, the effective sample rate corresponds to the number of channels multiplied by the rate at which pulses are produced by the mode-locked laser diodes.

24 Claims, 7 Drawing Sheets

5,010,346

ELECTRO-OPTICAL ANALOG-TO-DIGITAL CONVERTER AND METHOD FOR DIGITIZING AN ANALOG SIGNAL

FIELD OF TECHNOLOGY

This invention generally pertains to a high speed, analog-to-digital signal converter and a method for digitizing analog signals, and more specifically, to an A-D conversion apparatus and method that use a pulsed laser to sample the analog signal.

BACKGROUND OF THE INVENTION

Transformation of wideband data signals from the analog-to-digital domain may require sample rates that are generally not available in pure electronic A-D converters. Using currently available technology, electronic A-D converters are limited to about 2 gigasamples/second and about 4-bits/sample of resolution. Certain applications require A-D conversion of signals using a sample rate of from 5–10 gigasamples/second, with 6–8 bits of resolution. Ideally, the sample rate of a suitable A-D converter should be from 2.5 to 4 times the maximum bandwidth of the analog signal digitized.

The fastest commercially available A-D converters are flash converters, which comprise a sample and hold circuit and a digitizer circuit. By using demultiplexing or deinterleaving techniques, the sample rate of such electronic A-D systems may be extended to about two gigasamples per second at about 6-bits of resolution.

Recognizing the limitations on bandwidth, sampling rate, and resolution of electronic A-D converters, the prior art has turned to optical devices to substantially improve upon these parameters. For example, U.S. Statutory Invention Registration H353 discloses an optical converter with expanded dynamic range, which is achieved by dividing the input signal into an optically modulated light pulse signal comprising least significant bits (LSB) and most significant bits (MSB) representations. The LSB and MSB representations are then interleaved to form a final binary representation of the input analog signal. In the apparatus used to accomplish this task, a mode-locked laser provides a source of light pulses that are conveyed to a two channel linear, electro-optic, interferometric modulator, which is fabricated on a single crystal substrate. A phase bias is introduced in one of the modulated signals. Optical detectors convert the two LSB and MSB modulated signals emerging from the modulator and an unmodulated signal into analog electrical signals. A processor determines the digital values associated with the LSB and MSB representations based on values stored in a lookup table. While this method appears to improve the resolution of the conversion process, it is apparently limited to about one to two gigasamples/second.

In U.S. Pat. No. 4,502,037, an A-D converter that includes an optical modulator is disclosed, which includes one interferometer channel for each bit of a digital output word. The output word corresponds to the magnitude of an analog input signal. The modulator applies a phase shift to each channel used to modulate light from a laser source, and the modulated light is demodulated by an array of photodetectors and comparators to produce a corresponding digital signal. The patent teaches that the response time of the A-D converter is around one nanosecond per output word, no matter what the number of stages, i.e., about one gigasamples/second.

An alternative arrangement for an optical modulator A-D converter system is disclosed in U.S. Pat. No. 4,694,276. To achieve greater resolution, light from multiple wavelength lasers is combined and transmitted through an interferometric modulator. Light modulated therein in response to an analog input signal is split into two beams of different frequency using an optical grating or prism, and the beams are directed to photodetectors. The output of the photodetectors provides two bits of resolution. The patent teaches that additional lasers of different characteristic wavelengths or additional modulators and gratings can be provided to produce greater resolution. Since each bit-pair requires either two lasers or two modulator channels and a prism/grating, this technique appears to be unduly complex and inappropriate for use in some applications.

Accordingly, it is an object of the present invention to provide an A-D converter having a sample rate of up to ten gigasamples/second and with at least 6–8 bits of resolution. A further object is to minimize the cost of the A-D converter by keeping its fabrication cost and parts count relatively low. These and other objects and advantages of the present invention will be apparent from the attached drawings and the Description of the Preferred Embodiment that follows.

SUMMARY OF THE INVENTION

A high speed, electro-optical analog-to-digital convertor is claimed. It includes clock means for producing synchronization signals, and synchronized light source means, connected to receive the synchronization signals and operative to produce pulses of light in response. Modulator means are provided for modulating the intensity of the light pulses, so that the intensity of successive light pulses varies in time in response to the amplitude of the analog signal. Demultiplexing means are operative to demultiplex the light pulses produced by the synchronized light source means. Light pulses that have been demultiplexed are received by detector means, which produce electrical signals having a magnitude that is proportional to the intensity of the demultiplexed light pulses. A plurality of electrical, analog-to-digital converters are each connected to receive a different one of the electrical signals and a synchronization signal, and are operative to produce digital data that vary as a function of the magnitude of the electrical signals. These digital data correspond to the amplitude of the analog signal at the times the light pulses were modulated.

Preferably, the synchronized light source means comprise a mode-locked laser diode, and the demultiplexing means comprise splitter means for splitting each pulse of light produced by the mode-locked laser diode into a plurality of light pulses that are simultaneously output from the splitter means and conveyed to the modulator means. The demultiplexing means can further comprise delay means, for introducing a different delay interval in the time required for the light pulses simultaneously output from the splitter means to enter the modulator means. The modulator means include a plurality of modulation channels connected in parallel to the analog signal. Thus, each of the plurality of light pulses that are delayed enter a different modulation channel at different times, and the intensity of the light pulses passing through each modulation channel is modulated by the amplitude of the analog signal at one of the different times. Compensatory delay means can be disposed between the modulator means and the detector means, for delaying each of the demultiplexed and modulated light pulses by different intervals of time appropriate to compensate for the delay intervals introduced in the light pulses input to the modulator means, so that each of the demultiplexed and modulated light pulses arrive at the detector means at substantially the same time.

One of the light pulses from the splitter means comprises a reference light pulse that is not modulated as a function of the amplitude of the analog signal. The reference light pulse is separately supplied to the detector means to provide a reference intensity with respect to other light pulses output from the splitter means, in order to compensate for variations in the intensity of the light pulses produced by the mode-locked laser over time.

In one preferred form, the detector means comprise a plurality of separate photodetector channels. The demultiplexing means then can comprise switch means disposed between the modulator means and the detector means, for connecting successive modulated light pulses output from the modulator means to different photodetector channels, as a function of the synchronization signals produced by the clock means. The switch means can comprise an array of electronically controlled optical switches connected in series and spaced apart by a distance corresponding to the interval of time between successive modulated light pulses. Each optical switch has a plurality of outputs. At least one output of each optical switch is connected to one of the photodetector channels. Another output is connected to an input of another optical switch in the array, if any remain, and if not, to another of the photodetector channels. The switch means further comprise pulse divider means that are connected to receive the synchronization signals. For M optical switches in the array, the pulse divider means divide the synchronization signals by M, producing a gate control signal. In response to the gate control signal, the optical switches divert each of the modulated light pulses propagating through the array to a different photodetector.

Alternatively, the switch means can comprise a plurality of optical switches, each of which has an input and an output. The optical switches are connected in a fan-out array in which input and outputs of at least some of the optical switches are connected together in a parallel and series relationship. Terminal outputs of the fan-out array are each connected to a different photodetector. In this case, the demultiplexing means comprise switch control means that are connected to receive the synchronization signals and are operative to produce a plurality of different control signals, as a function of the synchronization signals. The control signals close specific optical switches to select a different modulated light pulse in a stream of successive modulated light pulses passing through the fan-out array, for input to each of the photodetectors. Delay means can be disposed between the array of optical switches and the detector means to delay the modulated light pulses input into each photodetector by a different interval of time. The intervals of time are selected so that the modulated light pulses arrive at the photodetectors at substantially the same time.

In another preferred form, the synchronized light source means comprise means for producing light pulses having substantially different wavelengths. Each light pulse is produced during a different portion of a period of the synchronization signal produced by the clock means. The analog-to-digital converter further comprises multiplexing means that are connected to receive the different wavelengths of light and are operative to produce a wavelength-division multiplexed signal that is input to the modulator means. Accordingly, the demultiplexing means comprise a wavelength-division demultiplexer disposed between the modulator means and the detector means, which produces a plurality of demultiplexed and modulated light pulses of the different wavelengths.

A method for electro-optically digitizing an analog signal at a high speed comprises a further aspect of this invention. The method includes steps that generally correspond to the functions performed by the analog-to-digital converter described above.

DISCLOSURE OF THE PREFERRED EMBODIMENTS

Figure 1:
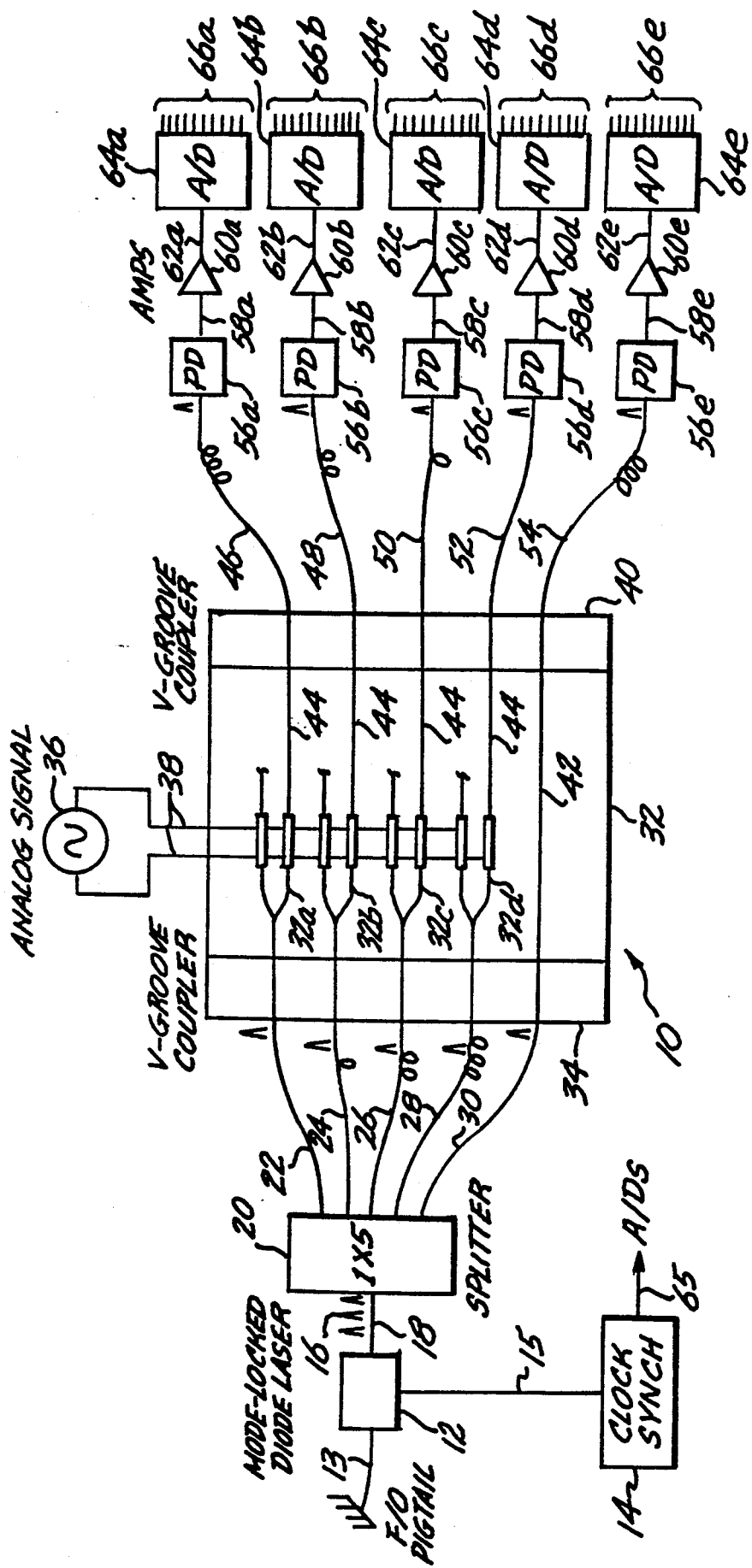
FIG. 1 is a schematic block diagram illustrating a first preferred form of an electro-optical analog-to-digital converter, employing space-division demultiplexing.

With reference to FIG. 1, a first embodiment of the electro-optical A-D system is shown, generally indicated at reference numeral 10. This embodiment uses a space-division demultiplexing architecture. Electro-optical A-D system 10 includes a mode-locked diode laser 12, which generates short optical pulses. As is common with mode-locked lasers, an appropriate length fiber-optic pigtail 13 (with an appropriate reflective tip - not shown) is connected at one end of the laser to establish the desired operational mode of the laser. The light pulses produced by mode-locked diode laser 12 are synchronized to a clock signal conveyed over a lead 15 from a clock synchronization circuit 14. Presently available diode lasers can produce light pulses having pulse widths of less than 10 picoseconds, at a repetition rate of up to 16 GHz, and with a pulse jitter of 0.1 to 0.5 picoseconds-fully adequate for this application.

Light pulses 16 produced by mode-locked diode laser 12 are conveyed over an optical fiber 18 to the input of an optical signal splitter 20. Splitter 20 may comprise a planar waveguide with a single-mode input and a plurality of "Y-branches" interconnected to split incoming light pulses for propagation through five (or more)

single-mode output channels. The optical splitter may also comprise a plurality of single-mode polarization maintaining fiber couplers with a fixed splitting ratio. A suitable fiber coupler is the Model 904P, available from Canadian Instrumentation and Research Limited. Again, several such devices connected in a tree structure (not shown) can provide the replicate light pulse outputs. Splitter 20 divides each incoming light pulse between five output optical fibers 22, 24, 26, 28, and 30. Only optical fibers 22 and 30 are of equal length, optical fibers 24, 26, and 28, each being successively longer so as to develop successively longer time delays for light pulses propagating through optical fibers 24, 26, and 28, respectively. Specifically, optical fiber 24 is sufficiently long to produce one nominal unit of time delay, while the length of optical fiber 26 produces two nominal units of time delay, and optical fiber 28, three units of time delay. Each unit of time delay is much less than the time interval between the pulses produced by mode-locked laser 12. As a result of the different time delays, the light pulses propagating through optical fibers 24-28 reach a silicon V-groove coupler 34, to which the ends of optical fibers 22-30 are joined, at different times. Silicon V-groove coupler 34 interfaces the optical fibers to a monolithic array of modulators 32, each of optical fibers 22-28 being connected respectively of one of the modulators 32a, 32b, 32c, and 32d, which comprise the array. Alternatively, a channel waveguide splitter could be incorporated onto the same substrate as waveguide modulator array 32, and each channel provided with an appropriate delay path. If the splitter were thus constructed, optical fiber 18 would be coupled to the substrate.

Waveguide modulator array 32 is of the 1×2 directional-coupler type. Alternatively, Mach-Zehnder interferometer, acousto-optic, or reversed delta-beta directional-coupler linear intensity modulators could also be used. Although the waveguide modulator array is illustrated as comprising an electrically lumped element circuit, a traveling wave modulator array configuration may also be used, possibly improving bandwidth and/or efficiency. Each of the modulators in the preferred embodiment modulator array 32 are thus shown connected in parallel to an analog signal via leads 38. The analog signal is produced by a source 36, representing any one of a number of different possible high frequency signal sources producing an analog signal for which analog-to-digital conversion is required. Modulators 32a-32d each modulate the succession of light pulses passing therethrough as a function of the intensity of the analog signal applied to the modulator array over leads 38 at a particular point in time. However, since a given light pulse produced by mode-locked diode laser 12 is split into pulses of light that pass through each of modulators 32a-32d at progressively later points in time, each of the modulators vary the intensity of the light pulses at a slightly different part of the analog signal. Using this arrangement, each pulse produced by mode-locked laser 12 samples the analog signal at a plurality of different points in time, due to the various delays introduced in the replications of the source pulse passing along optical fibers 22-28.

The intensity modulated light pulses are output from waveguide modulator array 32 through a silicon V-groove coupler 40. In addition, an unmodulated reference channel 42 is provided within the waveguide modulator array, and is operative to carry the light pulse input over optical fiber 30. The plurality of modulated light pulses are conveyed in channels 44 to optical fibers 46, 48, 50, and 52, while the unmodulated reference channel 42 is conveyed to an optical fiber 54. Each of optical fibers 46-54 are connected in V-groove coupler 40.

Optical fibers 46, 48, 50, and 54 optionally are cut to an appropriate length to provide time delays that compensate for time delays introduced by optical fibers 24-28. (A waveguide channel combiner with appropriate compensating time delays could also be incorporated on the substrate of waveguide modulator array 32.) Specifically, optical fiber 46 may include three units of time delay, optical fiber 48, two units, optical fiber 50, one unit, and optical fiber 54, three units. By introducing appropriate compensatory time delays, pulses propagating through optical fibers 46-54 arrive at photodetectors 56a, 56b, 46c, 56d, and 56e, substantially at the same time. The compensation equalizes the total propagation time of all replicate pulses, offsetting time delays introduced on the input side of waveguide modulator array 32. As the light pulses propagating through each of optical fibers 46-54 reach photodetectors 56, each of the photodetectors produce an electrical signal corresponding to the intensity of the light pulses input thereto. The photodetectors preferably comprise photodiodes. The electrical signals are output over leads 58a, 58b, 58c, 58d, and 58e, which are connected to the inputs of amplifiers 60a, 60b, 60c, 60d, and 60e, respectively.

The output signals from amplifiers 60 are conveyed over leads 62a, 62b, 62c, 62d, and 62e to the inputs of electrical analog-to-digital converters 64a, 64b, 64c, 64d, and 64e, respectively. Not only do amplifiers 60 increase the amplitude of the signal, but they also broaden the pulse width of the signal so that electrical analog-to-digital converters 64 can more readily produce digital signals representative of the amplitude of the electrical pulses input thereto. Clearly, it is important that amplifiers 60 either have equal gains, so as not to introduce errors in the amplitude of the signal monitored on each channel, or that any differences in the gain of each amplifier be corrected by calibrating each channel of the system.

If the compensatory time delays are omitted from optical fibers 46-54, the signals input to electrical analog-to-digital converters 64 are staggered in time by intervals corresponding to the delays introduced at the input to waveguide modulator array 32. However, in some applications, simultaneous digital outputs from electrical analog-to-digital converters 64 for each pulse generated by mode-locked diode laser 12 are preferable and the compensatory time delays should be provided.

A synchronization signal is produced by clock synchronization circuit 14, for input to each of the electrical analog-to-digital converters 64a-64e over leads 65. The synchronization signal triggers the electronic A-D converters to initiate an A-D conversion process at an appropriate time interval after mode-locked diode laser 12 produces a light pulse. This time interval includes the total time for a plurality of light pulses to transit waveguide modulator array 32, and for corresponding electrical signals from photodetectors 56 to reach the electrical A-D converters.

Electrical analog-to-digital converters 64a-64e produce output signals on electrical lines 66a-66e, each with 8 bits of resolution or precision. Each modulated light pulse input to one of the photodetectors 56a-56e causes a digital signal corresponding to the amplitude of the light pulse and thus corresponding to the analog value of the analog signal to be digitized with that degree of precision. Further, each of the digitized signals represents the value of the analog signal at a particular instant in time at which one of the replicated light pulses traveling through a specific waveguide modulator $32a$–$32d$ was modulated.

Figure 5:
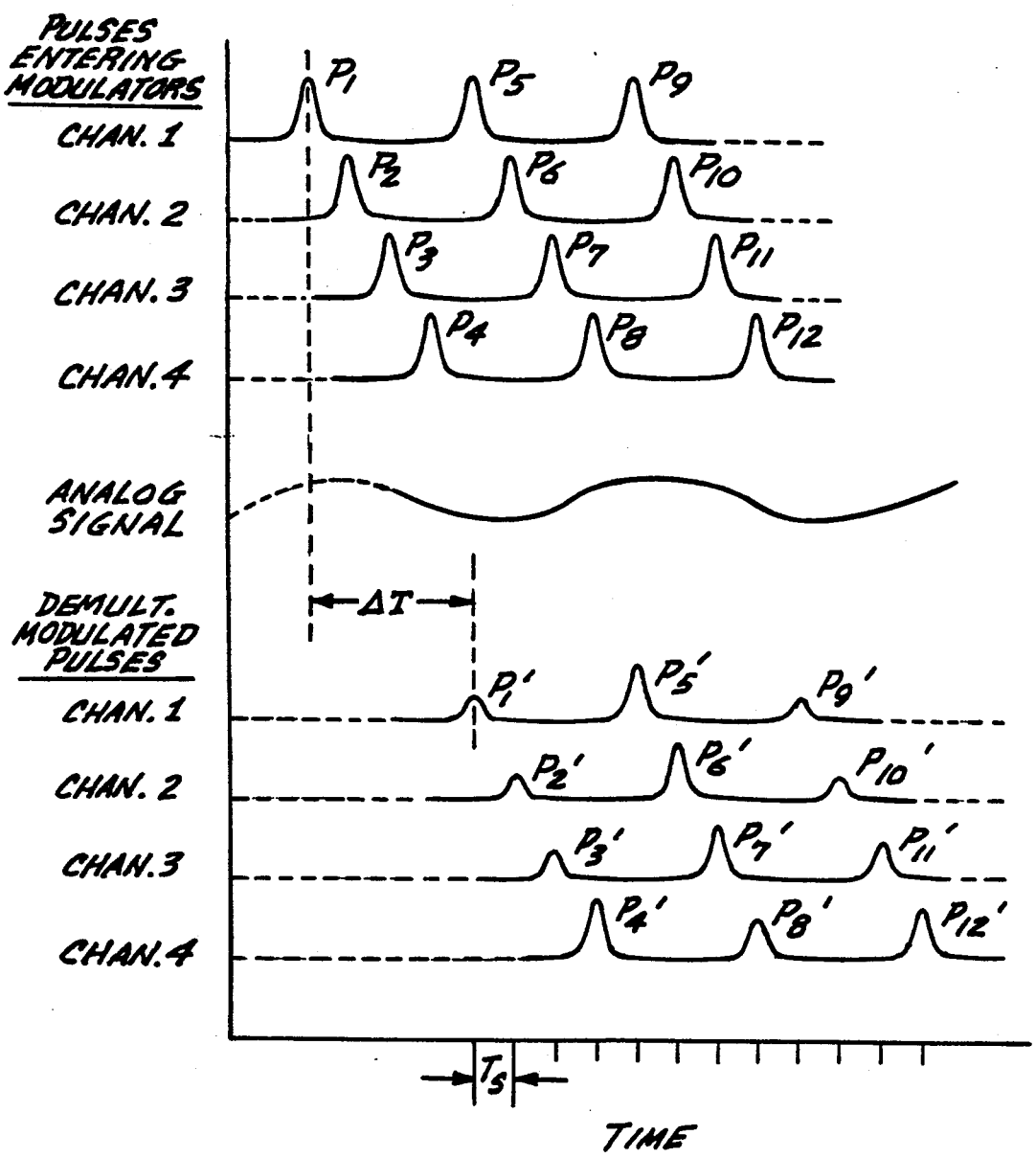
FIG. 5 is a timing diagram showing the time relationship of successive light pulses at different points in the first embodiment.

Turning to FIG. 5, the time relationship between the replicate pulses in each of the channels of electro-optical analog-to-digital converter 10 are graphically illustrated. At the top of the graph are shown the pulses $P_1$–$P_{12}$, as they enter modulators $32a$–$32d$. Pulses $P_1$–$P_{12}$ are of equal amplitude and are spaced apart in time as a function of the time delays introduced by optical fibers 22–28. The interval $\Delta T$ shown in FIG. 5 represents the delay between successive pulses output from mode-locked diode laser 12. In the lower portion of FIG. 5, the space-division demultiplexed modulated pulses $P_1'$–$P_{12}'$ are illustrated as they exit waveguide modulator array 32. Each of the pulses $P_1'$–$P_{12}'$ has been modulated so that its amplitude or intensity corresponds to the amplitude of the analog signal (shown in the center of FIG. 5) at the time the corresponding pulses, $P_1$–$P_{12}$, pass through modulators $32a$–$32d$. It should be apparent that channel 1 through channel 4 in FIG. 5 correspond to modulators $32a$–$32d$. Using the space-division demultiplexing method of this embodiment, the interval between successive samples of the analog signal is equal to $T_s$, as shown on the horizontal axis of the graph.

If the maximum specified sample rate of each of electrical analog-to-digital converters $64a$–$64e$ is equal to S, clock synchronization circuit 14 can be set to drive mode-locked diode laser source 12 with a pulse repetition rate up to S. The incremental nominal units of time delay introduced by optical fibers 24, 26, and 28 is optimally set equal to $1/M*S$, where M is equal to the number of electrical analog-to-digital converters used in connection with the modulated light pulse signals, i.e., M=4 in the preferred embodiment shown in FIG. 1. As a general rule, the rate at which optical pulses sample the input signal is equal to M*S.

The signal output from the electrical analog-to-digital converter $64e$ is used as a reference to correct for variations in the amplitude of light pulses produced by mode-locked diode laser 12 over time. Variations in the amplitude of such pulses at the laser affect the intensity of each modulated light pulse. Although the disclosed preferred embodiment includes only four electrical analog-to-digital converters for digitizing the modulated pulse signals, it is expected that up to about ten electrical analog-to-digital converters 64 could be used with a corresponding increase in the number of modulated light pulse channels to achieve even higher effective sample rates. However, if the analog signal produced by source 36 is much greater than one gigahertz, it is likely that it would be difficult to drive much more than four channels in modulator array 32. In addition, if the value for M is much more than 4, a loss in power of the laser pulse as it is split between each of the modulator channels may become significant with respect to signal-to-noise ratio at the input of the electrical analog-to-digital converters 64. In addition, as the bandwidth is increased, and the number of bits of resolution are increased, the jitter requirement for the mode-locked diode laser begins to approach 0.1 pico seconds. As a result, accuracy in the optical path length differences provided by optical fibers 22–30 becomes a small fraction of a millimeter. If an optical fiber distribution network is used for input and output of light signals to and from waveguide modulator array 32, this requirement for precision length optical fibers becomes somewhat impractical. If a computer generated, photolithographic mask were used to provide a monolithic waveguide distribution network having an input from optical fiber 18 for performing the function of splitter 20 on an integral waveguide device, it may be practical to provide up to 10 modulation channels. The second embodiment of the electro-optical analog-to-digital converter avoids many of these problems.

Figure 2:
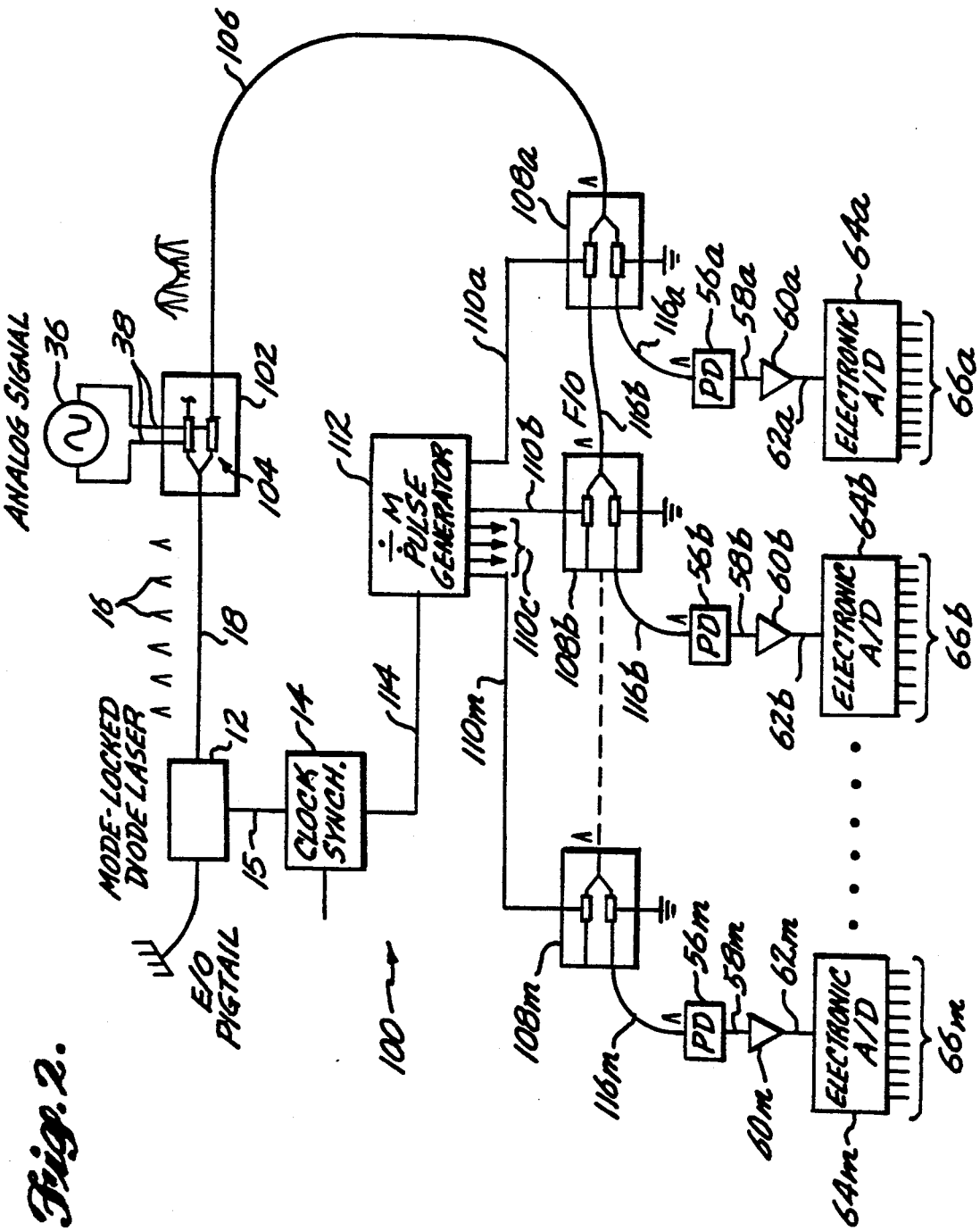
FIG. 2 is a schematic block diagram illustrating a second preferred form of the electro-optical analog-to-digital converter, employing time-division demultiplexing.

Turning now to FIG. 2, a second embodiment involving time-division demultiplexing of optical pulses is shown generally at reference numeral 100. With respect to this and the other embodiments described below, the same reference numerals are used to identify elements of each of the electro-optical analog-to-digital converters, where those elements provide the same function in each embodiment. For example, in electro-optical analog-to-digital converter 100, mode-locked diode laser 12 is again a source of light pulses 16 that are conveyed along optical fiber 18. Mode-locked diode laser 12 is triggered by a synchronization signal produced by clock synchronization circuit 14, also just as described in the previous embodiment. However, in electro-optical analog-to-digital converter 100, a single channel waveguide modulator 102 is used that includes an intensity modulator 104, which modulates light pulses 16 as a function of the amplitude of the electrical analog signal produced by analog signal source 36 at the point in time in which each pulse passes through modulator 102. Pulses of light that have been modulated are conveyed from modulator 102 over an optical fiber 106 to an array of serially connected optical switches $108a$–$108m$. Each light pulse propagating along optical fiber 106 is modulated at a different time, so that its intensity corresponds to the amplitude of the analog signal produced by analog signal source 36 at the time that the light pulse passed through modulator 102. Accordingly, optical switch $108a$ provides a first point at which the modulated light pulse propagating down optical fiber 106 may be diverted to one of photodetectors $56a$–$56m$. Optical switch $108a$ is controlled in response to an electrical signal input over a lead $110a$ from a divide-by-M pulse generator 112.

In the embodiment shown in FIG. 2, divide-by-M pulse generator 112 receives a clock synchronization signal from clock synchronization circuit 14 over a lead 114. Where there are M electrical analog-to-digital converters $64a$–$64m$, optical switch $108a$ receives every Mth synchronization pulse produced by clock synchronization circuit 14. In response to a synchronization pulse input over lead $110a$, optical switch $108a$ momentarily diverts the incoming light pulse to photodetector $56a$. Accordingly, as described above, the photodetector produces an electrical signal corresponding to the intensity of the light pulse, which is amplified by amplifier $60a$ and converted to a digital signal having 8 bits of resolution by electrical analog-to-digital converter $64a$.

The next optical pulse propagating along optical fiber 106 passes through optical switch $108a$ onto an optical fiber $116b$, through which it is input to an optical switch $108b$. As the pulse reaches optical switch $108b$, divide-by-M pulse generator 112 provides another synchronization signal that is input to optical switch $108b$ over a lead $110b$. In response to the synchronization signal, optical switch $108b$ diverts the incoming light pulse through an optical fiber 116b into photodetector 56b. A digital signal is produced by the downstream electronic analog-to-digital converter 66b as a function of the intensity of electrical pulse developed in response to this light pulse, as already described. Similarly, successive light pulses are directed by successive optical switches 108c–108m to the corresponding photodetector, until after M light pulses have been processed, the synchronization signal is again input to optical switch 108a to begin the sequence over again.

In order to ensure that a light pulse reaches each of the optical switches 108 in succession at the same instant that a synchronization signal causes an optical switch to divert a light pulse toward the appropriate photodetector, the length of each of the optical fibers 116 connecting successive optical switches 108 must be precisely controlled to match the intraswitch light pulse transit times to the intervals between synchronization signals. Optical switches 108 preferably comprise waveguide switches that respond to an applied voltage to divert an incoming light pulse between one of two output channels.

Any disadvantages in the design and operation of electro-optical analog-to-digital converter 100 relate to the accumulative losses incurred by light pulses passing through each successive junction between optical fibers 116 and optical switches 108. Such losses can be at least partially compensated by calibration of the system; however, as the losses increase, the system becomes incapable of monitoring meaningful variations in the intensity of light pulses at the Mth photodetector. The effective sample rate of the time-division demultiplexing technique used in electro-optical analog-to-digital converter 100 is equal to M times the rate of the individual electrical analog-to-digital converters. Typically a mode-locked diode laser is easily capable of providing the required jitter, sample rate, and aperture time for this application.

Figure 3:
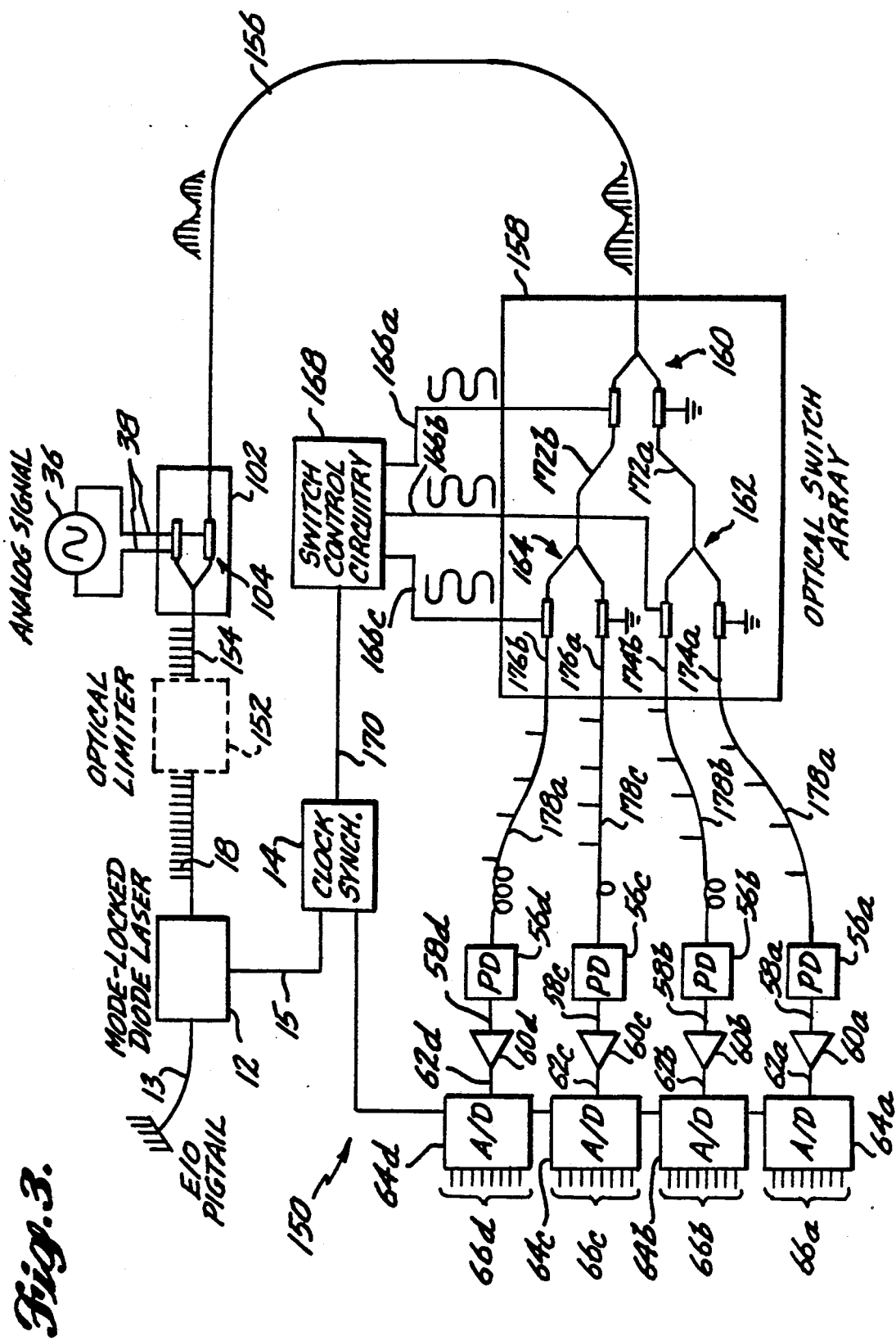
FIG. 3 is a schematic block diagram illustrating a third preferred form of the electro-optical analog-to-digital converter, employing time-division demultiplexing.

Turning now to FIG. 3, a more preferred embodiment of a time-division demultiplexing type of electro-optical analog-to-digital converter is shown, generally at reference numeral 150. In this embodiment, the discrete serially connected optical switches 108 shown in the preceding embodiment are replaced with a branching network comprising a waveguide optical switch array 158. As in the preceding embodiment, mode-locked diode laser 12 produces a series of optical pulses having substantially continuous amplitude, which propagate along an optical fiber 18. In FIG. 3, however, an optional optical limiter 152 is shown disposed between mode-locked diode laser 12 and modulator 102. The purpose of optical limiter 152 is to ensure that optical pulses input to the optical modulator have a continuous amplitude, so that variations in the intensity of the light pulse produced by the mode-locked diode laser are filtered and not interpreted as changes in the amplitude of the analog signal being used to modulate each of the light pulses in modulator 102. Optical limiter 152 can comprise a diode laser amplifier having a bistable output. Alternatively, a nonlinear optical etalon can be used for this purpose. The optical limiting capability of CuCl etalon has been demonstrated at wavelengths other than those obtainable from a diode laser; however, etalons constructed from different materials should provide the same optical limiting capability at diode laser wavelengths and power levels. (See Peyghambarian, N. Gibbs, H. M., Rushford, M. C. and Weinberger, D. A., "Observation of Biexcitonic Optical Bistability and Optical Limiting in CuCl," *Phys. Rev. Lett.* 51, pg. 1692 (1983)). The optical limiter may also be used in the preceding time-division multiplexed type electro-optical analog-to-digital converter 100. If a reference channel is not provided in electro-optical analog-to-digital converter 10 (see FIG. 1), the optical limited could also be inserted at some point along optical fiber 18 in that embodiment.

Modulated signals output from modulator 102 have an intensity corresponding to the amplitude of the analog signal produced by signal source 36 at the time each light pulse passes through modulator 102. These modulated optical pulses are conveyed over an optical fiber 156 to the input of optical switch array 158.

Optical switch array 158 includes a plurality of integral optical switches 160, 162, and 164, disposed in a series/parallel branching tree arrangement. Optical switch 160 is controlled by an electrical signal conveyed to it over leads 166a from a switch control circuit 168. Similarly, optical switches 162 and 164 are controlled by signals produced by the switch control circuit and conveyed to the optical switches over leads 166b and 166c, respectively. Switch control circuit 168 produces the signals to control the optical switches in response to a clock synchronization signal produced by clock synchronization circuit 14, which is connected to the switch control circuit by a lead 170.

Optical switch 160 has two branching output channels 172a and 172b. A light pulse entering optical switch 160 is diverted into one of the two channels in response to the switch control signal provided by switch control circuit 168. A light pulse propagating along optical fiber 156 is thus diverted to either optical switch 162 or 164 by optical switch 160. Similarly, optical switches 162 and 164 each include two output channels 174a and 174b, and 176a and 176b, respectively. A light pulse entering either of optical switches 162 or 164 is diverted into one of these four channels in response to the switch control signal provided by switch control circuit 168. Channels 174a, 174b, 176a, and 176b are respectively connected to optical fibers 178a–178d.

Optical fibers 178a–d may optionally be cut to different lengths to provide for successive delay times equal to integer multiples of the time interval between pulses produced by mode-locked diode laser 12, to ensure that successive light pulses arrive at photodetectors 56a–56d at the same point in time. For example, the first of four successive light pulses produced by mode-locked diode laser 12, can be selected to propagate into optical fiber 178d, which has an added transit time delay equivalent to three periods of the mode-locked diode laser. The next light pulse is selected by the optical switch array to propagate along optical fiber 178b, which has an added transit time delay equivalent to two periods of the mode-locked diode laser. Similarly, the third and fourth pulses in succession are selected to propagate along optical fibers 178c and 178a, and are subjected to added transit time delays equal to one period of mode-locked laser 12 in optical fiber 178c and to no additional delay in the other optical fiber, ensuring that all four pulses arrive at photodetectors 56a–56d at the same instant. The outputs of photodetectors 56a–56d are connected through amplifiers 60a–60d to electrical analog-to-digital converters 64a–64d so that the intensity of each of the four light pulses is converted to digital signals, which in the preferred embodiment are output with 8-bits of resolution over leads 66a–66d.

Additional numbers of optical switches can of course be included in optical switch array 158. The 1×4 demultiplexing capability of optical switch array 158 has been demonstrated at up to 16 gigabits per second. One of the advantages of using a waveguide optical switch array is that optical-throughput losses are minimized, compared to using discrete optical switches, as in electro-optical analog-to-digital converter 100. Furthermore, losses in each of the channels are equalized. The highest switching rate for the electro-optical switches in the optical switch array never exceeds the repetition rate of mode-locked diode laser 12, which is anticipated to be within a 1-10 gigapulse/second range—easily within the capability of waveguide type optical switches. For electro-optical analog-to-digital converter 150, the effective sample rate is equal to M times the rate of each of the electrical analog-to-digital converters 64a-64d, wherein the preferred embodiment shown in FIG. 3, M equals 4.

Figure 6:
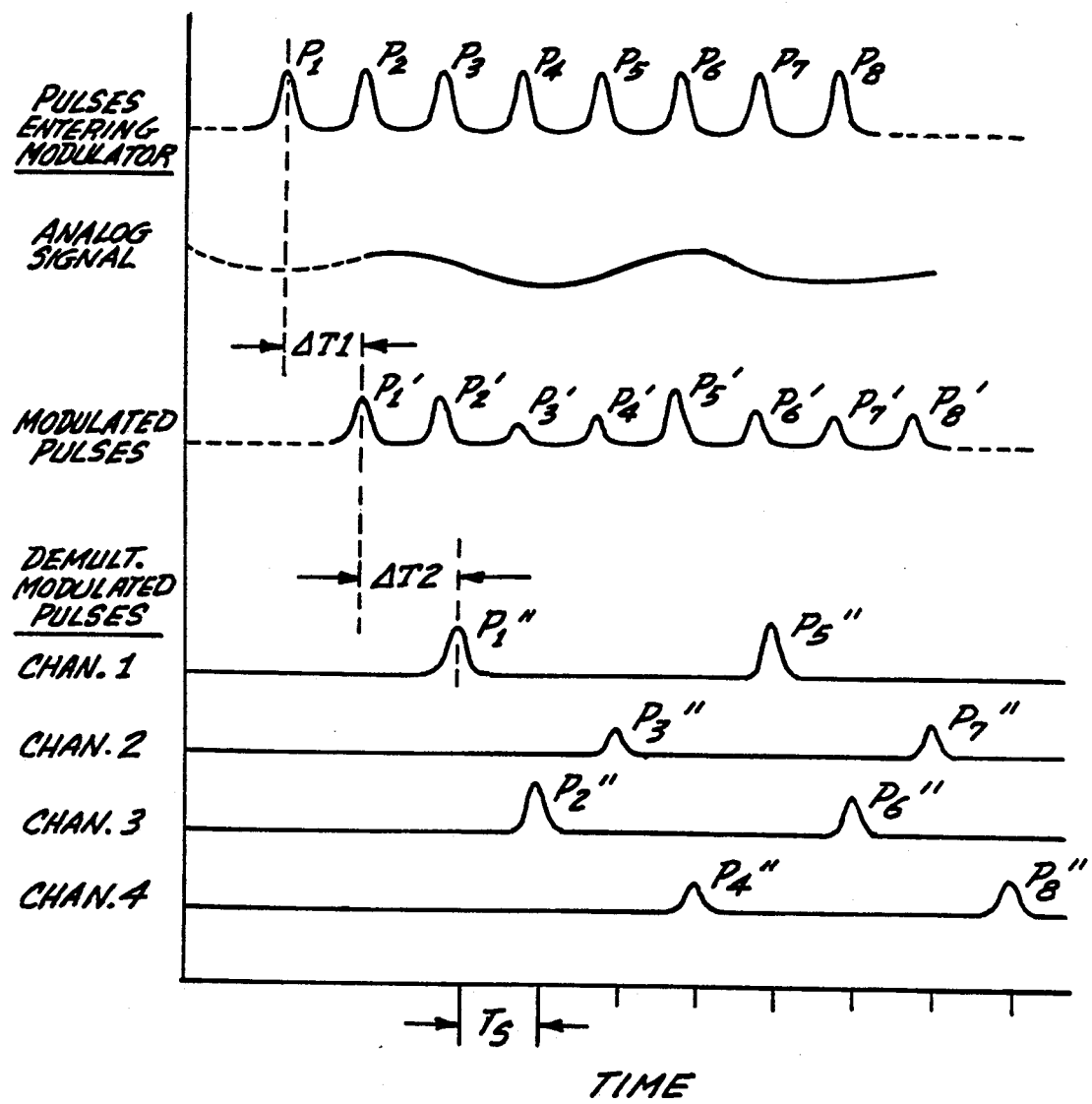
FIG. 6 is a timing diagram illustrating the time relationship of successive light pulses at different points in the time multiplexed embodiments.

The time relationship for light pulses propagating through electro-optical analog-to-digital converters 100 and 150 is illustrated in FIG. 6. A plurality of pulses $P_1-P_8$, having a constant amplitude, enter modulator 104. Modulated light pulses output from the modulator have an amplitude or intensity that corresponds to the amplitude of the analog signal being digitized at the time each light pulse passed through the modulator. The modulated pulses are identified by $P_1'-P_8'$. Again, $\Delta T1$ indicates the time delay between the input of a pulse to the modulator and its output. Similarly, $\Delta T2$ represents the delay between the time a pulse is output from the modulator and the time it is output from the demultiplexer, which corresponds to optical switches 108 in respect to electro-optical analog-to-digital converter 100, and to optical switch array 158 with respect to electro-optical analog-to-digital converter 150. The demultiplexed and modulated light pulses are output from the demultiplexer on each of channels 1-4. With respect to electro-optical analog-to-digital converter 100, M such channels should be illustrated to provide proper correspondence to the more general case illustrated in FIG. 2; however, if M=4, the two figures corresponds. The pulses identified by $P_1''-P_8''$ correspond to the amplitudes of the optical pulses output from output channels 176b, 174b, 176a, and 174a, respectively, as shown in FIG. 3. $T_S$ is again defined as the interval between successive light pulse samples of the analog signal.

Figure 4:
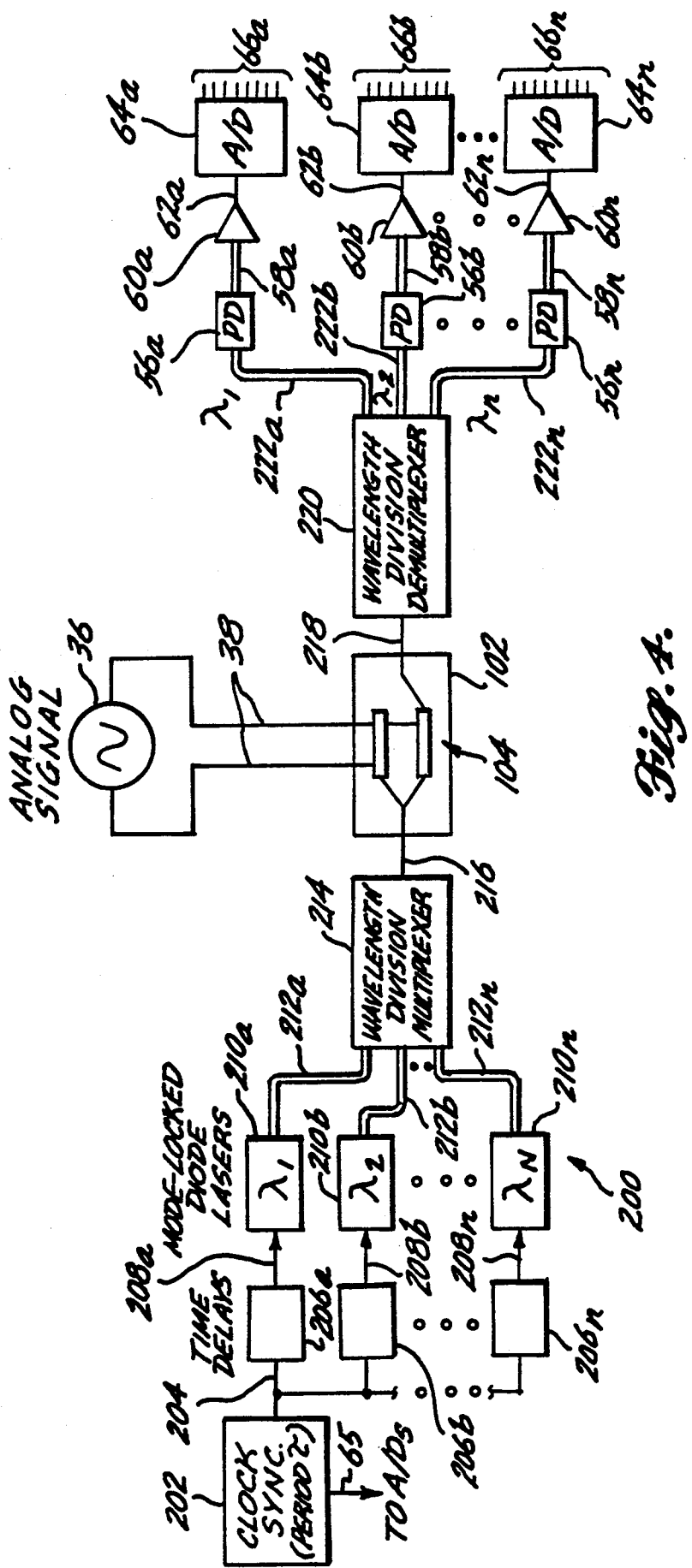
FIG. 4 is a schematic block diagram illustrating a fourth preferred embodiment, using wavelength-division demultiplexing.

A further embodiment of the electro-optical analog-to-digital converter, which uses wavelength-division demultiplexing, is shown generally at reference numeral 200, in FIG. 4. In electro-optical analog-to-digital converter 200, a clock sync circuit 202 produces reference synchronization pulses with a period $\tau$, which are input to a plurality of electrical time delay circuits 206a-206n that provide time delays, which are successively longer by equal amounts. For example, time delay circuit 206a provides a time delay equal to one nominal unit, time delay circuit 206b provides a time delay equal to two nominal units, and so on through time delay circuit 206n, which provides a time delay of N nominal units, where $N < \tau$.

The time delay circuits are connected by leads 208a-208n to a plurality of mode-locked diode lasers 210a-210n. Each of the mode-locked diode lasers operates at a different frequency, producing pulses having different wavelengths, $\lambda_1-\lambda_N$, which are output over optical fibers 212a-212n. Instead of using electrical time delay circuits 206a-206n to delay the synchronization signals that initiate light pulses output from mode-locked diode lasers 210, time delays can alternatively be provided by cutting optical fibers 212a-212n to appropriate different lengths.

The light pulses produced by mode-locked diode lasers 210 are conveyed to a wavelength-division multiplexer 214. Wavelength-division multiplexer 214 combines the separate synchronous pulse trains from each of mode-locked diode lasers 210 for input to modulator 104 over an optical fiber 216. The analog signal output from analog signal source 36 modulates the intensity of each successive light pulse propagating through modulator 104 at different points in time. N such successive light pulses have different wavelengths. The modulated light pulses are conveyed to a wavelength-division demultiplexer 220 through an optical fiber 218.

Wavelength-division demultiplexer 220 separates the successive incoming light pulses into different output channels as a function of the wavelength of the light pulse. A specific output channel is associated with each wavelength light pulse produced by mode-locked diode lasers 210. The demultiplexed and modulated light pulses output from wavelength-division demultiplexer 220 are conveyed through optical fibers 222a-222n to photodetectors 56a-56n, which convert the incoming light pulses into an electrical signal having an amplitude proportional to the intensity of the light pulses. Optionally, optical fibers 222 may be cut to appropriate different lengths to introduce time delays in the propagation of the optical pulses input to the photodetectors to compensate for the time delays provided with respect to the input of the clock synchronization signals at the input of mode-locked diode lasers 210 (or introduced in the optical fibers conveying light pulses from the mode-locked diode lasers to wavelength-division multiplexer 214).

In the embodiment shown in FIG. 4, the optional time delays are not included, and the light pulses input to photodetectors 56a-56n arrive at different points in time. The electrical signals produced by photodetectors 56a-56n in response to the light pulses are amplified by amplifiers 60a-60n, producing signals that are input to electrical analog-to-digital converters 64a-64n. As explained with respect to the preceding embodiments, electrical analog-to-digital converters 64 produce digital signals on electrical lines 66a-66n corresponding to the amplitude of the analog electrical signals input thereto. Electrical lines 66a-66n are represented as each having 8-bit resolution in the preferred embodiment illustrated in FIG. 4. Each group of digital output lines associated with the electrical analog-to-digital converters conveys a digital signal corresponding to the amplitude of the analog signal produced by analog signal source 36 at a different point in time. The effective sample rate of electro-optical analog-to-digital converter 200 is thus equal to N times the pulse rate of the synchronization signal produced by clock synchronization circuit 202.

Electro-optical analog-to-digital converter 200 represents the most preferred embodiment, since it enjoys benefits of both the space demultiplexed and the time demultiplexed embodiments described above. Like time demultiplexed-type electro-optical analog-to-digital converters 100 and 150, the wavelength-division technique used in respect to electro-optical analog-to-digital converter 200 requires only a single modulator 104. And, like space-division electro-optical analog-to-digital converter 10, this last most preferred embodiment demultiplexes each of the modulated light pulses in a passive manner, without the optical switching circuits and complexity of switch control required in the time demultiplexed embodiments.

Figure 7:
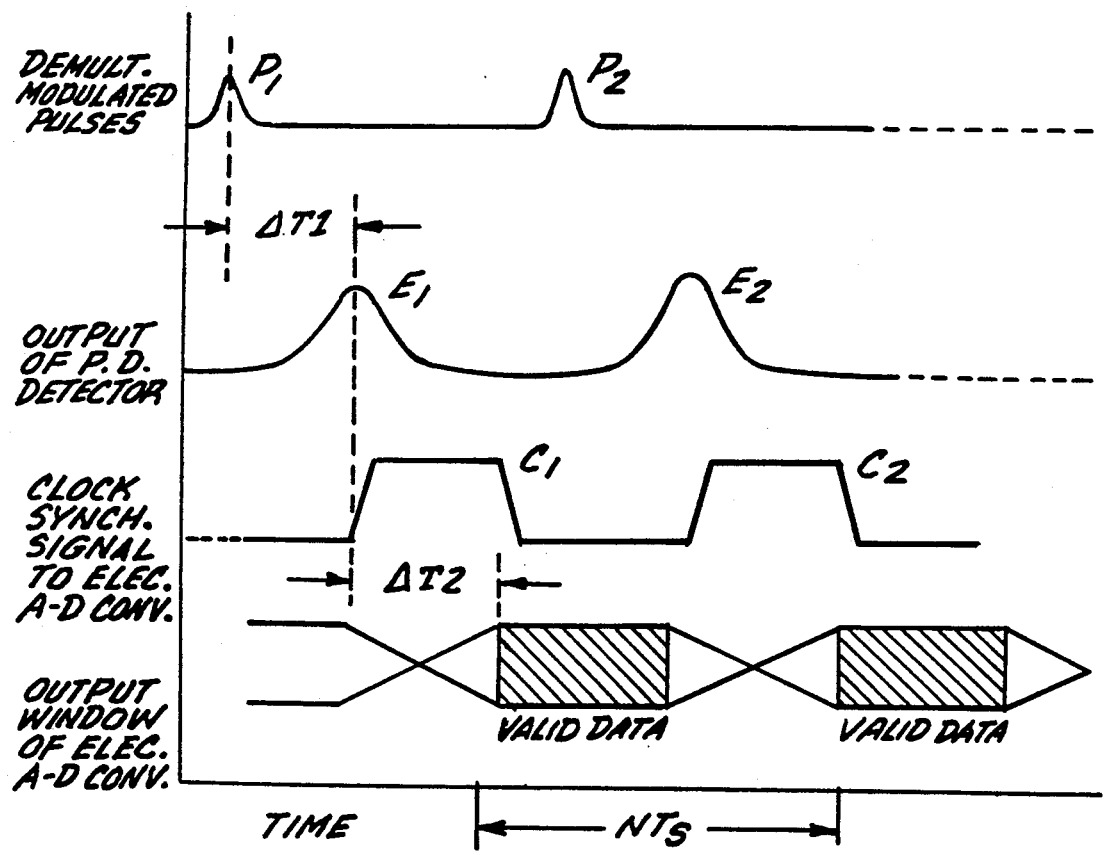
FIG. 7 is a timing diagram illustrative of the time relationship of signals in one channel of electronic A-D conversion as used with the present invention.

Turning now to FIG. 7, a timing diagram for one channel of the electrical analog-to-digital conversion portion of each of the embodiments is illustrated. Only two demultiplexed modulated pulses are represented in FIG. 7, and they are identified by $P_1$ and $P_2$. The interval $\Delta T1$ is the delay between the time at which each of the pulses enters the photodetector for that channel and an electrical signal is output, corresponding to the intensity of the light pulse, as represented by $E_1$ and $E_2$. Electrical pulses $E_1$ and $E_2$ enter the electrical analog-to-digital converter and are converted into digital data when the electrical analog-to-digital converter for that channel receives a synchronization signal, identified in FIG. 7 by the positive going edges of $C_1$ and $C_2$. The delay between positive and negative going edges of the synchronization signal defines the interval $\Delta T2$, which is the delay between the electrical analog-to-digital converters receiving the electrical pulses and the output of valid data therefrom in the form of the digitized signals. Valid data is present on the digital signal lines 66, with respect to each of the embodiments, during the time that the synchronization signal is between pulses $C_1$ and $C_2$. The interval between N successive samples of the analog signal being digitized is represented on the horizontal axis by $NT_S$, wherein N is the number of output channels used in the preferred embodiment.

While the present invention has been described with respect to several preferred embodiments and modifications thereto, those of ordinary skill in the art will appreciate that further modifications may be made to this invention within the scope of the claims that follow below. Accordingly, the scope of the invention should not be limited by the description of the preferred embodiments, but instead, is to be determined entirely by reference to the claims.

The embodiments of the invention in which an exclusive property or privilege is claimed are defined as follows:

1. A high speed, electro-optical analog-to-digital converter, for digitizing an analog signal, comprising:
   (a) clock means for producing synchronization signals;
   (b) light source means, connected to receive the synchronization signals and operative to produce pulses of light in response thereto;
   (c) modulator means for modulating an intensity of the pulses of light as a function of an amplitude of the analog signal and thereby producing modulated light pulses, light pulses entering the modulator means at successively different times being modulated in response to the amplitude of the analog signal at those different times;
   (d) demultiplexing means, for demultiplexing the light pulses produced by the light source means;
   (e) detector means, connected to receive light pulses that have been demultiplexed by the demultiplexing means and modulated by the modulating means, for producing electrical signals having a magnitude proportional to the intensity of said light pulses; and
   (f) a plurality of electrical analog-to-digital converters, each connected to receive a different one of the electrical signals and to receive the synchronization signals produced by the clock means, for producing digital data that vary as a function of the magnitude of said electrical signals, said digital data produced thereby corresponding to the amplitude of the analog signal at the different times.

2. The high speed, electro-optical analog-to-digital converter of claim 1, wherein the light source means comprise a mode-locked laser diode.

3. The high speed, electro-optical analog-to-digital converter of claim 2, wherein the demultiplexing means comprise splitter means for splitting each pulse of light produced by the mode-locked laser diode into a plurality of replicate light pulses that are simultaneously output from the splitter means and conveyed to the modulator means.

4. The high speed, electro-optical analog-to-digital converter of claim 3, wherein the demultiplexing means further comprise delay means for introducing a different delay interval in the time required for each of the replicate light pulses simultaneously output from the splitter means to enter the modulator means, said modulator means including a plurality of modulation channels connected in parallel to the analog signal, each of the plurality of replicate light pulses entering different modulation channels at the different times, so that the intensity of the light pulses passing through each modulation channel is modulated by the amplitude of the analog signal at one of said different times.

5. The high speed, electro-optical analog-to-digital converter of claim 4, further comprising compensatory delay means, disposed between the modulator means and the detector means, for delaying each of the demultiplexed and modulated light pulses by different intervals of time appropriate to compensate for the delays introduced in the light pulses input to the modulator means so that each of the demultiplexed and modulated light pulses arrive at the detector means at substantially the same time.

6. The high speed, electro-optical analog-to-digital converter of claim 4, wherein one of the light pulses from the splitter means comprises a reference light pulse that is not modulated as a function of the amplitude of the analog signal, said reference light pulse being separately supplied to the detector means to provide a reference intensity with respect to the other light pulses output from the splitter means, in order to compensate for variations in the intensity of the light pulses produced by the mode-locked laser diode over time.

7. The high speed, electro-optical analog-to-digital converter of claim 1, wherein the detector means comprise a plurality of separate photodetector channels, and wherein the demultiplexing means comprise switch means disposed between the modulator means and the detector means and connected to the clock means, for diverting successive modulated light pulses output from the modulator means to different photodetector channels as a function of the synchronization signals produced by the clock means.

8. The high speed, electro-optical analog-to-digital converter of claim 7, wherein the switch means comprise an array of electronically controlled optical switches connected in series and spaced apart by a distance over which light pulses travel in a transit time corresponding to the interval of time between successive modulated light pulses, each optical switch having a plurality of outputs, at least one output of each optical switch being connected to one of the photodetector channels, another output being connected to an input of either a next serially connected optical switch in the array, if any remain, and otherwise, to another of the photodetector channels.

9. The high speed, electro-optical analog-to-digital converter of claim 8, wherein the switch means further comprise pulse divider means, connected to receive the synchronization signals, for dividing the synchronization signals by an integer value M, producing a gate control signal for controlling the optical switches, where M is equal to the number of optical switches in the array, said optical switches responding to the gate control signal to divert each of the modulated light pulses propagating through the array to a different photodetector channel.

10. The high speed, electro-optical analog-to-digital converter of claim 7, wherein the switch means comprise a plurality of optical switches, each having an input and an output, said optical switches being connected in a tree-branching fan-out array in which inputs and outputs of the optical switches are connected together in a series-parallel relationship, terminal outputs of the tree-branching fan-out array being each connected to a different photodetector channel.

11. The high speed, electro-optical analog-to-digital converter of claim 10, wherein the demultiplexing means further comprises switch control means, connected to receive the synchronization signals, for producing a plurality of different control signals as a function of the synchronization signals, said control signals closing specific optical switches to select a different modulated light pulse in a stream of successive modulated light pulses passing through the tree-branching fan-out array for input to each of the photodetector channels.

12. The high speed, electro-optical analog-to-digital converter of claim 11, further comprising delay means, disposed between the array of optical switches and the detector means, for delaying the modulated light pulses input to each photodetector channel by a different interval of time, the intervals being selected so that the modulated light pulses arrive at the photodetector channels at substantially the same time.

13. The high speed, electro-optical analog-to-digital converter of claim 1, wherein the light source means comprise means for producing light pulses having substantially different wavelengths, each light pulse being produced during a different portion of a period of the synchronization signal produced by the clock means.

14. The high speed, electro-optical analog-to-digital converter of claim 13, further comprising multiplexing means, connected to receive the different wavelength light pulses, for producing a wavelength-division multiplexed signal that is input to the modulator means.

15. The high speed, electro-optical analog-to-digital converter of claim 14, wherein the demultiplexing means comprise a wavelength-division demultiplexer disposed between the modulator means and the detector means, said wavelength-division demultiplexer producing a plurality of demultiplexed and modulated light pulses of said different wavelengths.

16. A method for electro-optically digitizing an analog signal at high speed, comprising the steps of:
 (a) producing a synchronization signal;
 (b) producing pulses of light in response to the synchronization signal;
 (c) modulating an intensity of the pulses of light at different times as a function of an amplitude of an analog signal and thereby producing modulated light pulses that have intensities, which correspond to the amplitude of the analog signal at said different times;
 (d) producing demultiplexed light pulses from the light pulses produced in response to the synchronization signal;
 (e) producing electrical signals in response to the synchronization signal, said electrical signals having a magnitude proportional to an intensity of the demultiplexed light pulses; and
 (f) producing digital data that vary as a function of the magnitude of the electrical signals, said digital data corresponding to the amplitude of the analog signal at the different times.

17. The method of claim 16, wherein the step of demultiplexing comprises the step of splitting each pulse of light produced in response to the synchronization signal into a plurality of replicate light pulses that are conveyed to the modulator means.

18. The method of claim 17, wherein the step of demultiplexing further comprises the step of delaying for a different interval of time the replicate light pulses prior to the step of modulating each replicate light pulse, so that the replicate light pulses that have been demultiplexed are each modulated at the different times in response to the amplitude of the analog signal at said different times.

19. The method of claim 18, further comprising the step of delaying each of the demultiplexed and modulated light pulses by different intervals of time appropriate to compensate for the delays introduced in demultiplexing the replicate light pulses, so that the step of producing electrical signals can be effected for each of the demultiplexed and modulated light pulses at substantially the same time.

20. The method of claim 16, wherein the step of demultiplexing comprises the step of connecting successive modulated light pulses to a selected one of a plurality of photodetectors through an optical switch, where said selected one of the photodetectors is determined as a function of the synchronization signal.

21. The method of claim 16, wherein the step of producing pulses of light in response to the synchronization signal comprises the step of producing light pulses having substantially different wavelengths during different portions of the period of the synchronization signal.

22. The method of claim 21, further comprising the step of producing a wavelength-division multiplexed signal from the light pulses of different wavelengths, the intensity of said wavelength-division multiplexed signal being modulated during the step of modulating.

23. The method of claim 22, wherein the step of demultiplexing comprises the step of producing a plurality of demultiplexed and modulated light pulses of said different wavelengths.

24. A high speed, electro-optical analog-to-digital converter, for digitizing an analog signal, comprising:
 (a) a stable source of coherent light;
 (b) modulator means for successively sampling the analog signal at different times and modulating an intensity of the coherent light as a function of an amplitude of the analog signal at each of the different times so as to produce a modulated coherent light that multiplexes the amplitude of the analog signal at the different times;
 (c) demultiplexing means for optically demultiplexing the modulated coherent light, producing a demultiplexed light;

(d) detector means or producing electrical signals, said detector means having a plurality of channels that receive the demultiplexed light, each channel producing an electrical signal having a magnitude proportion to an intensity of the coherent light that was modulated at a different time and demultiplexed;

(e) a plurality of electrical analog-to-digital converters, each connected to one of said plurality of channels in order to receive one of the electrical signals produced by the detector means, for producing digital data that vary as a function of the magnitude of said electrical signals, said digital data produced thereby corresponding to the amplitude of the analog signal at the different times.

* * * * *